(12) United States Patent
Xiao et al.

(10) Patent No.: US 11,644,746 B1
(45) Date of Patent: May 9, 2023

(54) INVERSE ETCH MODEL FOR MASK SYNTHESIS

(71) Applicant: Synopsys, Inc., Mountain View, CA (US)

(72) Inventors: Guangming Xiao, Austin, TX (US); Hua Song, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/161,345

(22) Filed: Jan. 28, 2021

Related U.S. Application Data

(60) Provisional application No. 62/967,475, filed on Jan. 29, 2020.

(51) Int. Cl.
*G06F 30/398* (2020.01)
*G03F 1/70* (2012.01)

(52) U.S. Cl.
CPC .............. *G03F 1/70* (2013.01); *G06F 30/398* (2020.01)

(58) Field of Classification Search
CPC ........ G03F 7/705; G03F 7/70633; G03F 1/36; G03F 7/70625; G03F 7/70441; G03F 1/70; G03F 7/70616; G03F 7/70683; G03F 1/44; G03F 7/70641; G03F 7/70516; G03F 9/7003; G03F 1/76; G03F 1/50; G03F 7/7065; G03F 1/80; G03F 7/70433; G03F 7/7085; G03F 1/20; G03F 1/86; G03F 7/70125; G03F 1/68; G03F 7/70558; G03F 1/78; G03F 7/70191; G03F 7/70508; G03F 9/7019; G03F 7/20; G03F 7/70491; G03F 7/70525; G03F 7/70608; G03F 9/7076; G03F 1/62; G03F 7/2004; G03F 7/70108; G03F 7/70425; G03F 7/70691; G03F 9/7049; G03F 1/24; G03F 1/84; G03F 7/70158; G03F 7/70166; G03F 7/70483; G03F 7/70958; G03F 9/7088; G03F 7/0002; G03F 7/0005; G03F 7/2002; G03F 7/2008; G03F 7/70058; G03F 7/70091; G03F 7/701; G03F 7/70283; G03F 7/70458; G03F 7/70466; G03F 7/70541; G03F 7/7055; G03F 7/70566; G03F 7/706; G03F 7/70666; G03F 7/70775; G03F 7/70866; G03F 9/7023; G03F 1/72; G03F 7/70133;

(Continued)

(56) References Cited

U.S. PATENT DOCUMENTS

2016/0335384 A1* 11/2016 Song .................... G06F 30/392
2018/0144936 A1* 5/2018 Cho ..................... G03F 7/70058
2019/0311083 A1* 10/2019 Feng ........................ G03F 1/36

* cited by examiner

*Primary Examiner* — Binh C Tat
(74) *Attorney, Agent, or Firm* — Park, Vaughan, Fleming & Dowler LLP; Laxman Sahasrabuddhe

(57) ABSTRACT

A first set of critical dimension (CD) measurements of resist patterns created by a lithography process and a second set of CD measurements of water patterns created by an etch process may be obtained. A forward etch model and an inverse etch model may be calibrated together by reducing (1) a first prediction error between the second set of CD measurements and a first set of simulated CDs predicted by the forward etch model based on the resist patterns, a second prediction error between the first set of CD measurements and a second set of simulated CDs predicted by the inverse etch model based on the wafer patterns, and a matching error between the forward etch model and the inverse etch model.

20 Claims, 6 Drawing Sheets

(58) Field of Classification Search
CPC .. G03F 7/704; G03F 7/70533; G03F 7/70783; G03F 9/7026; G03F 9/7046; G03F 9/7084; G03F 7/70258; G03F 7/70658; G03F 7/70675; G03F 7/70725; G06F 30/398; G06F 2119/18; G06F 30/39; G06F 30/20; G06F 2111/10; G06F 30/30; G06F 30/392; G06F 30/33; G06F 30/337; G06F 30/00; G06F 30/367; G06F 30/23; G06F 30/394; G06F 17/10; G06F 17/18; G06F 17/12; G06F 2111/04; G06F 2111/06; G06F 2119/08; G06F 2119/10; G06F 2119/12; G06F 2119/22; G06F 18/214; G06F 18/24133; G06F 18/2431; H01L 21/0274; H01L 21/31116; H01L 21/31138; H01L 21/31144; H01L 21/32139; H01L 22/12; C12Q 1/6874; C12Q 1/6869; C12Q 2565/607
USPC .................................................. 716/50–56
See application file for complete search history.

INVERSE ETCH MODEL FOR MASK SYNTHESIS

RELATED APPLICATION

This application claims the benefit of U.S. Provisional Application Ser. No. 62/967,475, filed on 29 Jan. 2020, the contents of which are herein incorporated by reference in their entirety for all purposes.

TECHNICAL FIELD

The present disclosure relates to integrated circuit (IC) design, verification, and manufacturing. More specifically, the present disclosure relates to inverse etch model for mask synthesis.

BACKGROUND

Etch is an important step in a semiconductor manufacturing process, during which resist patterns are transferred onto a wafer. It is desirable to quickly and accurately determine mask patterns that can print a desired design intent onto a wafer.

SUMMARY

Some embodiments described herein may obtain a first set of critical dimension (CD) measurements of resist patterns created by a lithography process, and a second set of CD measurements of wafer patterns created by an etch process. Next, the embodiments may calibrate a forward etch model and an inverse etch model together by reducing (1) a first prediction error between the second set of CD measurements and a first set of simulated CDs predicted by the forward etch model based on the resist patterns, (2) a second prediction error between the first set of CD measurements and a second set of simulated CDs predicted by the inverse etch model based on the wafer patterns, and (3) a matching error between the forward etch model and the inverse etch model.

In some embodiments, the first prediction error may include a term based on $(w-F_{etch}(r))$, where r represents the first set of CD measurements of resist patterns, w represents the second set of CD measurements of wafer patterns, and $F_{etch}$ represents the forward etch model. In some embodiments, the second prediction error may include a term based on $(r-G_{etch}(w))$, where $G_{etch}$ represents the inverse etch model. In some embodiments, the matching error between the forward etch model and the inverse etch model may include a first term based on $(w-F_{etch}(G_{etch}(w)))$ and/or a second term based on $(r-G_{etch}(F_{etch}(r)))$.

Some embodiments may determine a resist target by applying the inverse etch model to a design intent. Next, the embodiment may determine a mask layout by performing lithography correction on the resist target. The embodiments may then determine simulated resist patterns based on the mask layout using a lithography model. Next, the embodiments may determine simulated wafer patterns based on the simulated resist patterns using the forward etch model. In some embodiments, the forward etch model and the inverse etch model may be a matching pair of models. The embodiments may then verify the mask layout by comparing the design intent with the simulated wafer patterns.

Some embodiments may use a level set method (LSM) when determining contours using the forward etch model and/or the inverse etch model. Specifically, LSM may be used to determine the resist target by applying the inverse etch model to the design intent and determine the simulated wafer patterns based on the simulated resist patterns using the forward etch model.

BRIEF DESCRIPTION OF THE FIGURES

The disclosure may be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
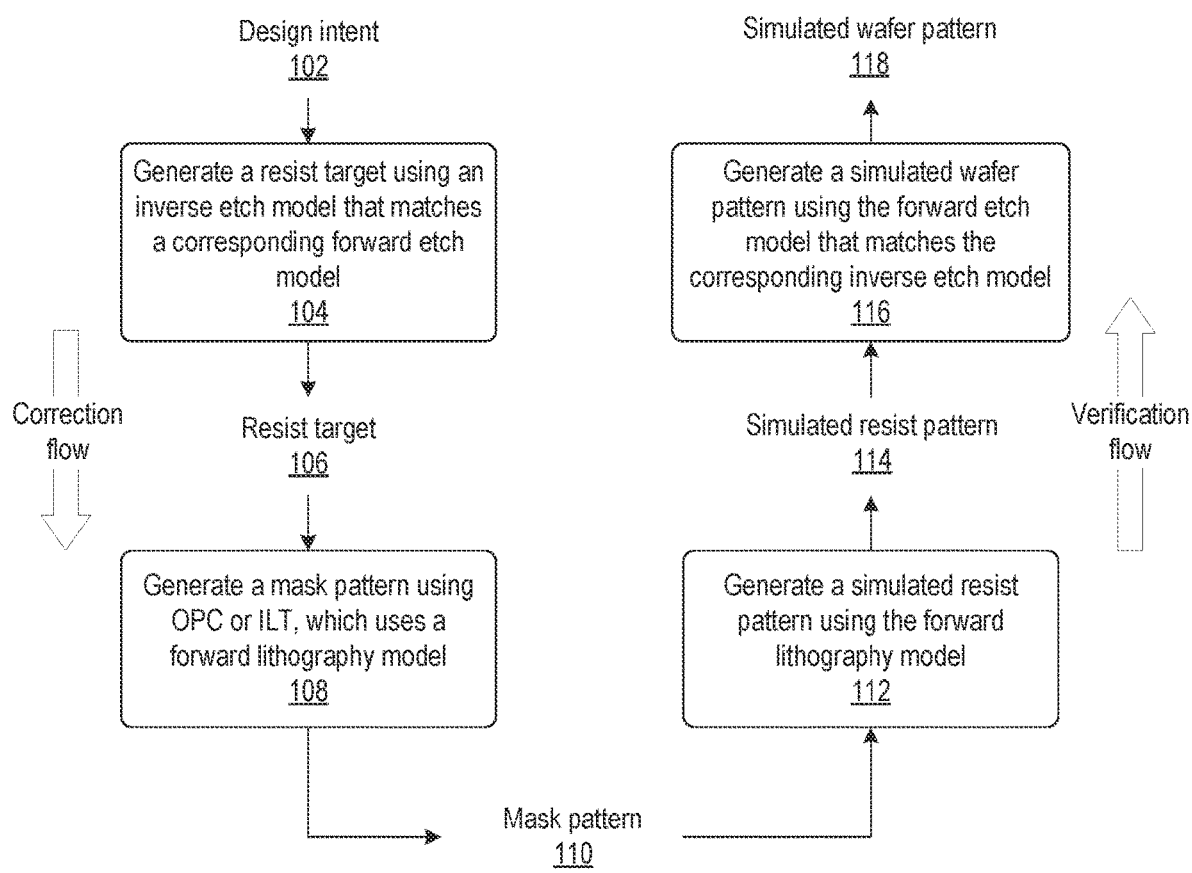
FIG. 1 illustrates a correction and verification flow in accordance with some embodiments described herein.

Aspects of the present disclosure relate to using an inverse etch model to determine a resist target based on a design intent. A design intent includes shapes that are desired to be printed on a wafer, and a resist target includes resist patterns which are expected to print the design intent on the wafer after etch.

The resist target may be determined by compensating for the effects of an etch process. Some existing approaches compensate the effect of an etch process by using a "rules-based" approach. As critical dimensions (CD) continue to shrink, and CD tolerances continue to become tighter, such rules-based approaches are becoming inadequate to accurately model the effects of etch processes and the interactions between lithography and etch processes.

Certain approaches may use an iterative technique to determine a resist target based on a design intent by using a forward etch model. A forward etch model refers to a model that generates a printed wafer pattern based on a resist pattern. Such forward etch model based iterative techniques can use a significant amount of computation time, and result in non-physical contours.

Embodiments disclosed herein feature an inverse etch model that can generate a resist target from a design intent directly by using a single simulation run (as opposed to multiple simulation runs used by iterative techniques). Advantages of embodiments disclosed herein include, but are not limited to, (1) reducing the amount of computation time used for generating the resist target, (2) producing smoother resist target contours, and (3) easier adoption in existing mask synthesis flows.

Lithography may be used to generate resist patterns based on mask patterns, and an etch process may be used to transfer the resist patterns onto the wafer. A forward lithography model may be used to model the effects of lithography.

Specifically, a forward lithography model takes a mask m as input and generates a developed resist pattern r as output. The word "forward" in the phrase "forward model" refers to the fact that the inputs and outputs of a forward model corresponds to the inputs and outputs, respectively, of a semiconductor manufacturing process that the forward model models. The forward lithography model may be represented as:

$$F_{resist}(m)=r. \quad (1.1)$$

A forward etch model takes a developed resist pattern r as input and generates a post-etch wafer pattern w as output. The forward etch model may be represented as:

$$F_{etch}(r)=w. \quad (1.2)$$

The combined effect of the lithography and etch processes may be represented as:

$$F_{etch}(F_{resist}(m))=w. \quad (1.3)$$

The forward lithography and etch models, $F_{resist}$ and $F_{etch}$ respectively, may be constructed from wafer measurement data by using a model calibration process. For example, to calibrate a forward etch model, the following data may be used: (1) test patterns, which specify resist contours or after development inspection (ADI) targets, and (2) measured data, which may include etch biases, i.e., (AEI_CD—ADI_CD), where AEI_CD is the after etch inspection (AEI) CD and ADI_CD is the ADI CD. The forward etch model may include multiple types of modeling terms including, but not limited to, loading terms, visible area terms, and blocked area terms.

The task of mask synthesis is to solve for "m" for a given "w" in equation (1.3). Some approaches solve for "m" by solving equation (1.1) and (1.2) separately, i.e., these approaches use staged correction that includes staged resist and etch models. Techniques that solve equation (1.1) may be referred to as lithography correction techniques, which include but are not limited to, optical proximity correction (OPC) and inverse lithography technique (ILT). Lithography correction techniques determine a mask m based on a resist target r, such that the resist patterns in the resist target r are expected to be created when mask in is used in the lithography process. Techniques that solve equation (1.2) are referred to as etch correction techniques. Etch correction techniques determine a resist target r based on wafer pattern w, such that the shapes in the wafer pattern w are expected to be printed on the wafer when the etch process is applied to resist target r. Etch generally refers to a process that removes material from selected areas. Patterns may be created using an etch-resistant material (e.g., a resist) where material is not desired to be removed. During the etch process material is removed in areas that are not covered by the etch resistant material.

Thus, given a design intent w (which are the patterns that are desired to be printed on the wafer), solving (1.2) provides the resist target r, and then solving (1.1) using r provides the mask layout m. Clearly, etch correction is performed before lithography correction.

In certain approaches for etch correction, the input may be the AEI target or the design intent, i.e., the patterns that are desired to be printed on the wafer. The output may be the ADI target, i.e., the resist patterns that are expected to print the design intent after etch. The etch correction process in existing approaches may use an iterative segment-based correction. Specifically, w in the etch equation (1.2) is the desired wafer pattern, which is the design intent with possible changes such as some degree of corner rounding.

Certain approaches may use Newton's method (or any other suitable numerical technique) to solve equation (1.2). For example, the following expression may be used for iteratively solving equation (1.2):

$$r_{n+1}=r_n+(w-F_{etch}(r_n))/F_{etch}'(r_n), \quad (1.4)$$

where $r_i$ is the resist pattern in the $i^{th}$ iteration and $F_{etch}'$ is the gradient of the forward etch model. An initial guess for r can be the target wafer pattern, i.e., $r_0$=w. A single iteration of Newton's method results in:

$$r_1=w+(w-F_{etch}(w))/F_{etch}'(w). \quad (1.5)$$

Some approaches (known as "etch retargeting") use the single step etch correction shown in equation (1.5). Specifically, a bias is applied to the target wafer pattern w, and the bias amount is the predicted etch bias (w−$F_{etch}$(w)) scaled by the reciprocal of the forward etch model's gradient ($F_{etch}'$(w)). More iterations of equation (1.4) may be performed to obtain a more accurate resist target. However, as semiconductor manufacturing technologies continue to move to smaller technology nodes, such existing techniques are proving to be inadequate because they may use a large amount of computational time and produce inaccurate and non-physical contours.

FIG. 1 illustrates a correction and verification flow in accordance with some embodiments described herein. In the correction flow, mask pattern 110 may be created based on design 102. Specifically, design intent 102 may be used to generate resist target 106 using an inverse etch model that matches a corresponding forward etch model (at 104). Next, mask pattern 110 may be generated based on resist target 106 using optical proximity correction (OPC) or inverse lithography technique (ILT), which uses a forward lithography model (at 108).

Mask pattern 110 may be verified using a vetification flow that creates a simulated wafer pattern 118 based on mask pattern 110. Specifically, simulated resist pattern 114 may be generated based on mask pattern 110 using the forward lithography model (at 112). Next, simulated wafer pattern 118 may be generated based on simulated resist pattern 114 using the forward etch model that matches the corresponding inverse etch model (at 116), If simulated wafer pattern 118 is within a tolerance limit of design intent 102, mask pattern 110 may be used to create masks for use in a semiconductor manufacturing process.

Embodiments described herein build an inverse etch model, and use the inverse etch model to directly generate a resist target based on the design intent by using a single simulation. Specifically, some embodiments may use a level set method (LSM) to generate a smooth contour when using either the forward etch model or the inverse etch model.

To determine the forward and inverse etch models, embodiments described herein may use the same empirical data set (e.g., resist and etch CDs and contours) that is used for calibrating a traditional forward etch model. Moreover, the same or similar model terms may be used for calibrating both forward and inverse etch model. In some embodiments, the inverse etch model and the forward etch model may be built separately. In some embodiments, the inverse etch model and the forward etch model may be built simultaneously to provide a pair of matching models. Specifically, during model calibration, the optimization cost that is used during regression may include terms that correspond to fitting individual inverse and forward models to the empirical data, as well as one or more terms that correspond to matching the inverse and forward models.

The inverse etch model that is built by embodiments described herein may have significantly faster runtimes and may generate more accurate and smoother resist contours. Embodiments described herein may be easily integrated into existing mask synthesis flows (e.g., resolution enhancement techniques (RET), OPC, and ILT flows), and embodiments described herein may use a single simulation operation to compute the output contour. Embodiments described herein may be more easily adopted by existing mask synthesis flows because an inverse etch model may use a single simulation to generate the resist contour, which may naturally fit into the computational flow that is used by traditional rule-table based retargeting approaches.

Figure 2:
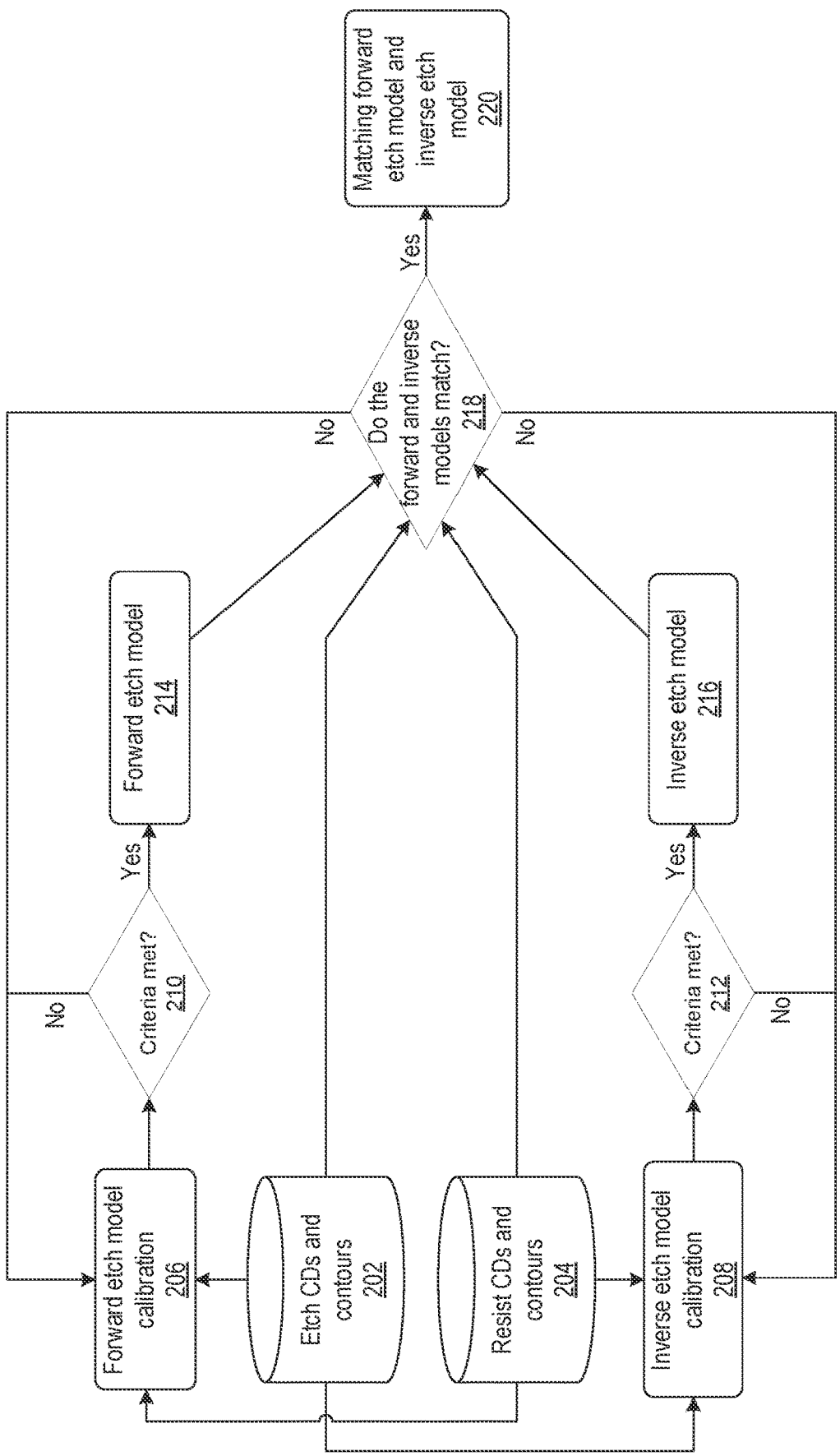
FIG. 2 illustrates a process for building a pair of matching inverse and forward etch models in accordance with some embodiments described herein.

FIG. 2 illustrates a process for building a pair of matching inverse and forward etch models in accordance with some embodiments described herein, A lithography process may be applied to a set of design intents to generate a set of resist patterns. The resist patterns may then be inspected using an inspection tool, and CDs and contour shapes of the resist patterns may be measured to obtain resist CDs and contours 204. Next, an etch process may be used to create wafer patterns based on the resist patterns. The wafer patterns may then be inspected using an inspection tool, and CDs and contour shapes of the wafer patterns may be measured to obtain etch CDs and contours 202.

Forward etch model calibration (at 206) may be performed using resist CDs and contours 204 and etch CDs and contours 202. Next, a set of criteria may be checked for the forward etch model (at 210). If the criteria are not met ("No" branch), the process may return to forward etch model calibration (at 206). This iterative process may continue until a forward etch model has been built that meets the set of model criteria. Once the criteria have been met ("Yes" branch), a forward etch model is obtained (at 214).

Inverse etch model calibration (at 208) may be performed using etch CDs and contours 202 and resist CDs and contours 204. Next, a set of model criteria may be checked for the inverse etch model (at 212). If the criteria are not met ("No" branch), the process may return to inverse etch model calibration (at 208). This iterative process may continue until an inverse etch model has been built that meets the set of criteria. Once the criteria have been met ("Yes" branch), an inverse etch model is obtained (at 216).

In some embodiments, the set of model criteria may include, but are not limited to, a model convergence criterion and a model verification criterion. The model convergence criterion may be met when the model parameters converge to a set of fitted values. For example, the change in the model parameters in each iteration may be monitored, and if the change falls below a threshold value (or remains below a threshold value for a certain number of iterations), then the process may conclude that, the model convergence criterion has been met. For the model verification criterion, the set of resist CDs and contours 204 and etch CDs and contours 202 may be partitioned into a calibration dataset and a verification dataset. The calibration dataset may be used to calibrate the forward etch model (at 206) and the inverse etch model (at 208). Next, the verification dataset may be compared with simulated CDs and/or contours generated by the calibrated forward and inverse etch models, If the difference between the verification dataset and the simulated CDs and/or contours is less than a threshold, then the process may conclude that the model verification criterion has been met.

The process may determine if the forward etch model 214 and the inverse etch model 216 match each other (at 218) within a tolerance threshold by using etch CDs and contours 202 and resist CDs and contours 204. In some embodiments, forward etch model 214 and inverse etch model 216 match each other if the composite functions $F_{etch}(G_{etch}(x))$ and/or $G_{etch}(F_{etch}(x))$ are substantially the same as the identity function. If the forward etch model 214 and the inverse etch model 216 match each other ("Yes" branch), then the forward etch model 214 and the inverse etch model 216 may be provided (at 220) for use during correction and verification flows as shown in FIG. 1. Otherwise ("No"branch), the process may return to calibrating the forward etch model (at 206) and calibrating the inverse etch model (at 208).

Specifically, some embodiments may fit $F_{etch}^{-1}$ with a model $G_{etch}$ directly from wafer measurement data, so that:

$$r = G_{etch}(w) \tag{2.1}$$

To calibrate the inverse etch model, the following data may be used: (1) test patterns, which specify resist contours or after etch inspection (AEI) targets, and (2) measured data, which may include reverse etch biases, i.e., (ADI_CD—AEI_CD). The inverse etch model may include multiple types of terms including, but are not limited to, loading terms, visible area terms, and blocked area terms. Unlike the forward etch model, the inverse etch model does not simulate an actual physical process. The inverse etch model simulates "undoing" the etch process. The inverse etch model may be used to directly predict the ADI contour that would result in the given AEI target by using a single simulation. Thus, in the etch correction flow, a given AEI target may be provided as input to the inverse etch model, and the resist contour generated by the inverse etch model corresponds to the ADI target that would result in the given AEI target if the etch process were to be applied to the ADI target.

The same empirical data set (resist and wafer CD measurements and contours) may be used to build either a forward etch model ($F_{etch}$) or an inverse etch model ($G_{etch}$). In some embodiments, the forward etch model and the inverse etch model are matched with each other, so that:

$$w = F_{etch}(G_{etch}(w)) \tag{3.1}$$

and, $$r = G_{etch}(F_{etch}(r)). \tag{3.2}$$

Model calibration typically does not perfectly fit the empirical data, and a residual error may remain. Thus, equations (3.1) and (3.2) may not be exact equalities (i.e., the equality signs in equations (3.1) and (3.2) may be replaced by "approximately equal" signs). The difference between the left-hand sides and the right-hand sides of equations (3.1) and (3.2) may be viewed as a cost term or a matching error term of the paired models.

During the etch model calibration, the cost term from equation (3.1) may be constrained as follows:

$$|w - F_{etch}(w))| < \sigma, \tag{3.3}$$

where $\sigma$ is a tolerance threshold for matching the forward etch model and the inverse etch model. The left-hand side of inequality (3.3) is an expression that is based on the difference between (1) the wafer pattern w and (2) a simulated pattern that is obtained by applying the inverse etch model followed by the forward etch model to the wafer pattern w. Additionally, the cost term from equation (3.2) may be constrained as follows:

$$|r - G_{etch}(F_{etch}(r))| < \sigma. \tag{3.4}$$

Inequality (3.4) may also be checked as a quality measure during the paired etch model calibration. The left-hand side of inequality (3.4) is an expression that is based on the difference between (1) the resist pattern r (resist CD and resist contour) and (2) a simulated resist pattern (CD and contour) that is obtained by applying the forward etch model followed by the inverse etch model to the resist pattern r. In some embodiments, inequalities (3.3) and/or (3.4) may be used as a termination condition during model calibration. In other words, the model calibration process illustrated in FIG. 2 may terminate and provide the matched forward and inverse etch models as output when inequalities (3.3) and/or (3.4) are satisfied.

In some embodiments, both the forward etch model and the inverse etch model may be built independently, and then validated using inequalities (3.3) and (3.4). In some embodiments, the forward etch model and the inverse etch model may be built together (note that the model terms used in the two models may be the same or similar). During calibration (also referred to as "model fitting"), an objective function or a cost function may be defined that represents how well the models fit the empirical data, and how well the models match each other. Specifically, the cost function may include a cost term that corresponds to the fitting error (or prediction error) of each model and may include an additional term that corresponds to the matching error between the forward etch model and the inverse etch model.

Figure 3A:
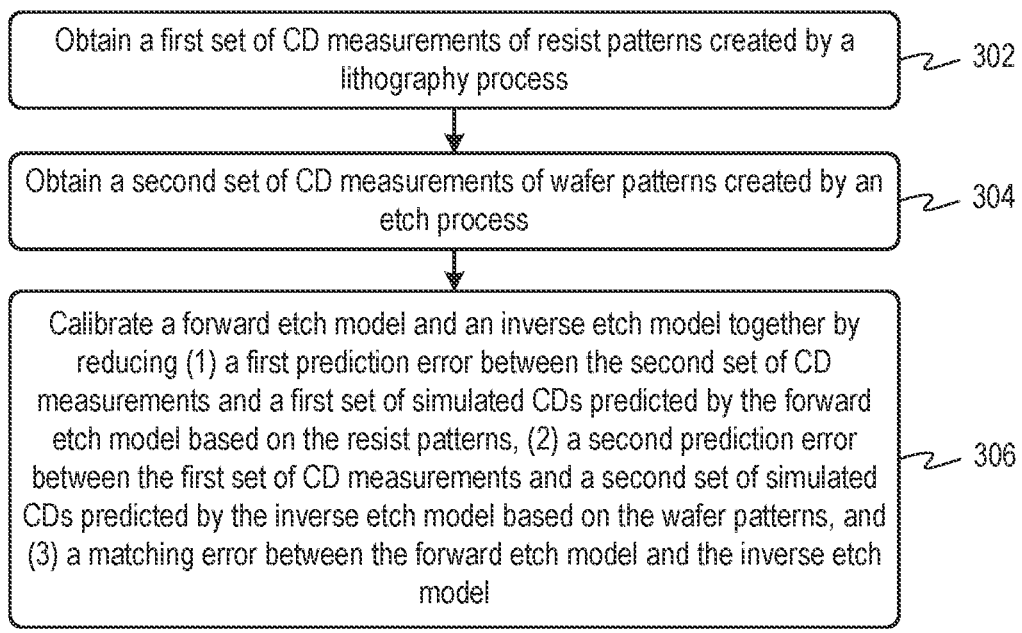
FIG. 3A illustrates a process for creating a matching pair of forward and inverse etch models in accordance with some embodiments described herein.

FIG. 3A illustrates a process for creating a matching pair of forward and inverse etch models in accordance with some embodiments described herein.

The process may begin by obtaining a first set of CD measurements of resist patterns created by a lithography process (at 302). Next, the process may obtain a second set of CD measurements of wafer patterns created by an etch process (at 304). The process may then calibrate a forward etch model and an inverse etch model together by reducing (1) a first prediction error between the second set of CD measurements and a first set of simulated CDs predicted by the forward etch model based on the resist patterns, (2) a second prediction error between the first set of CD measurements and a second set of simulated CDs predicted by the inverse etch model based on the wafer patterns, and (3) a matching error between the forward etch model and the inverse etch model (at 306).

Specifically, the first prediction error may include a term that is based on the expression $(w-F_{etch}(r))$, e.g., $|w-F_{etch}(r)|$. The second prediction error may include a term based on $(r-G_{etch}(w))$, e.g., $|r-G_{etch}(w)|$. The matching error between the forward etch model and the inverse etch model may include terms that are based on the expressions $(w-F_{etch}(r))$ and $(r-G_{etch}(w))$. In some embodiments, the total cost function that is optimized during model calibration may be a weighted sum of the above-mentioned terms. During the simultaneous calibration of both the forward etch model and the inverse etch model, the co-optimization regression may be constrained as follows:

$$|w-F_{etch}(r)|+|r-G_{etch}(w)|<\sigma. \quad (3.5)$$

where σ is a tolerance threshold of model regression convergence criteria. And, the quality measure of the paired forward etch model and the inverse etch model may be constrained as follows:

$$|w-F_{etch}(G_{etch}(w))|+|r-G_{etch}(F_{etch}(r))|<\beta, \quad (3.6)$$

where β is a tolerance threshold for matching the forward etch model and the inverse etch model.

Figure 3B:
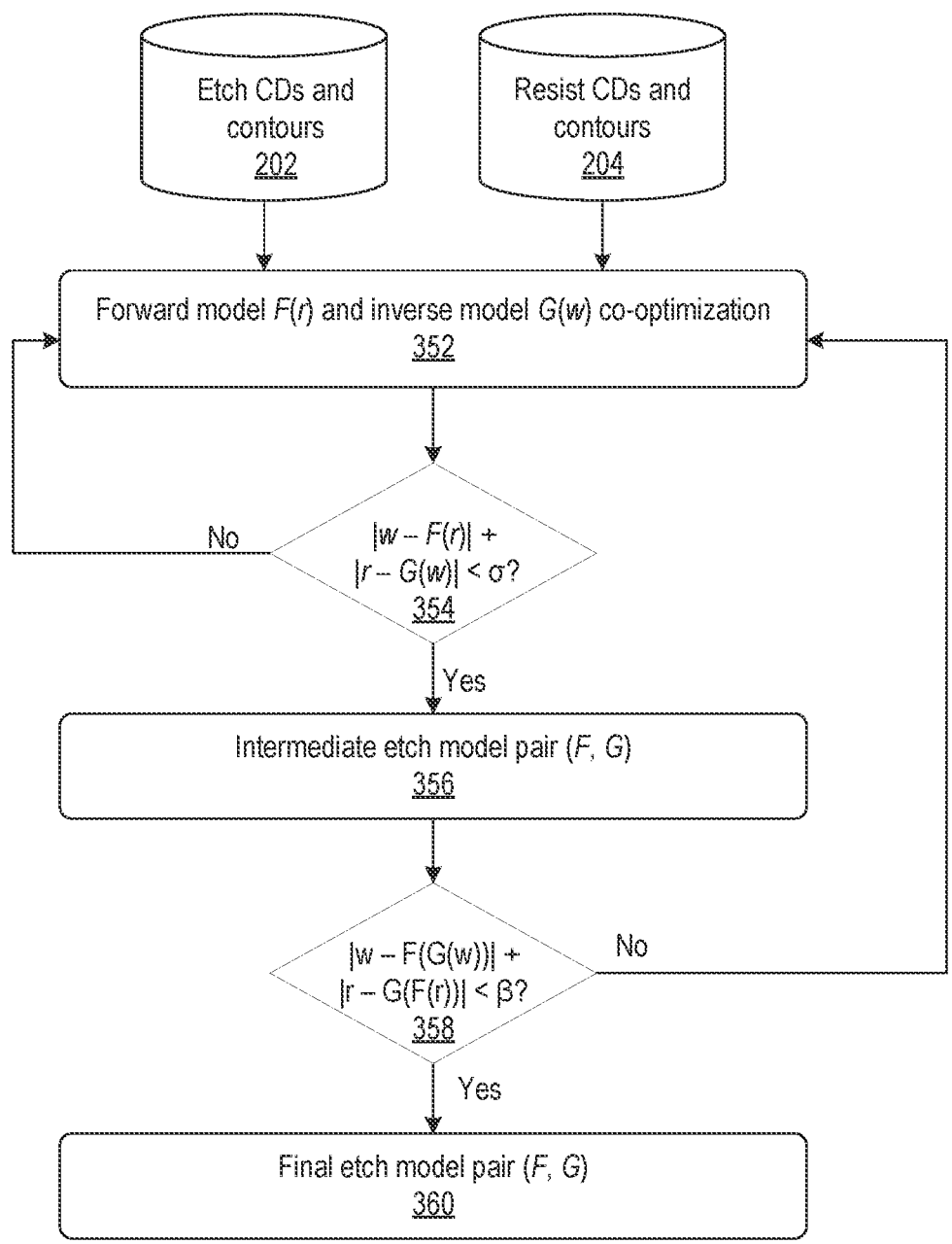
FIG. 3B illustrates a process for creating a matching pair of forward and inverse etch models in accordance with some embodiments described herein.

FIG. 3B illustrates a process for creating a matching pair of forward and inverse etch models in accordance with some embodiments described herein.

The process may begin by performing forward model F(r) and inverse model G(w) co-optimization (at 352) based on etch CDs and contours 202. and resist CDs and contours 204. Next, the process may check if inequality (3.5), i.e., $|w-F_{etch}(r)|+|r-G_{etch}(w)|<\sigma$, has been satisfied (at 354). If so ("Yes"branch), intermediate etch model pair (F, G) 356 has been determined, and intermediate etch model pair (F, G) 356 may be further analyzed to determine if the model pair is a matched pair. If inequality (3.5) has not been satisfied ("No" branch), the process may return to 352. Next, for intermediate etch model pair (F, G) 356, the process may check if inequality (3.6), i.e., $|w-F_{etch}(G_{etch}(w))|+|r-G_{etch}(F_{etch}(r))|<\beta$, is satisfied (at 358). If so ("Yes" branch), final etch model pair (F, G) 260 has been determined, and may be used in correction and verification flows. If inequality (3.6) has not been satisfied ("No" branch), the process may return to 352.

In some embodiments, the input to the inverse etch model $G_{etch}$ may be a set of polygons (referred to as "w" above), and the output of the inverse etch model $G_{etch}$ may indicate the amount by which each point on each polygon edge is to be moved (in a direction perpendicular to the polygon edge) to generate the resist target. In some embodiments, the edges of the set of polygons may be dissected into segments, and each segment may be moved by an amount that is computed using $G_{etch}$. After all segments on all polygon edges have been moved, the segments may be joined together to form the resist contour. However, this approach may lead to non-physical shapes that have a non-smooth (i.e., jagged) contour, and it may be difficult to correctly connect the displaced segments near polygon corners.

Some embodiments described herein produce smooth resist target contours from the design intent by using an LSM. Specifically, in the level set equation $$\frac{\partial \varphi}{\partial t} = v|\nabla \varphi|, \varphi(x, y, t)$$

is the level-set function of two spatial variables (x, y) and one time variable t, and v(x, y) is the bias determined by the inverse etch model $G_{etch}$. The design intent layout can be converted into an initial value of the level-set function, φ(x, y, 0), for example using the signed distance function. A single step forward finite difference in t with Δt=1 yields an output function φ(x, y, 1)=φ(x, y, 0)+v(x,y)|∇φ(x, y, 0)|. A contour of the output function at threshold value 0 may be computed to generate a smooth contour of the resist target as follows:

$$R=\{(x,y):\varphi_1(x,y,1)=0\}$$

Figure 4:
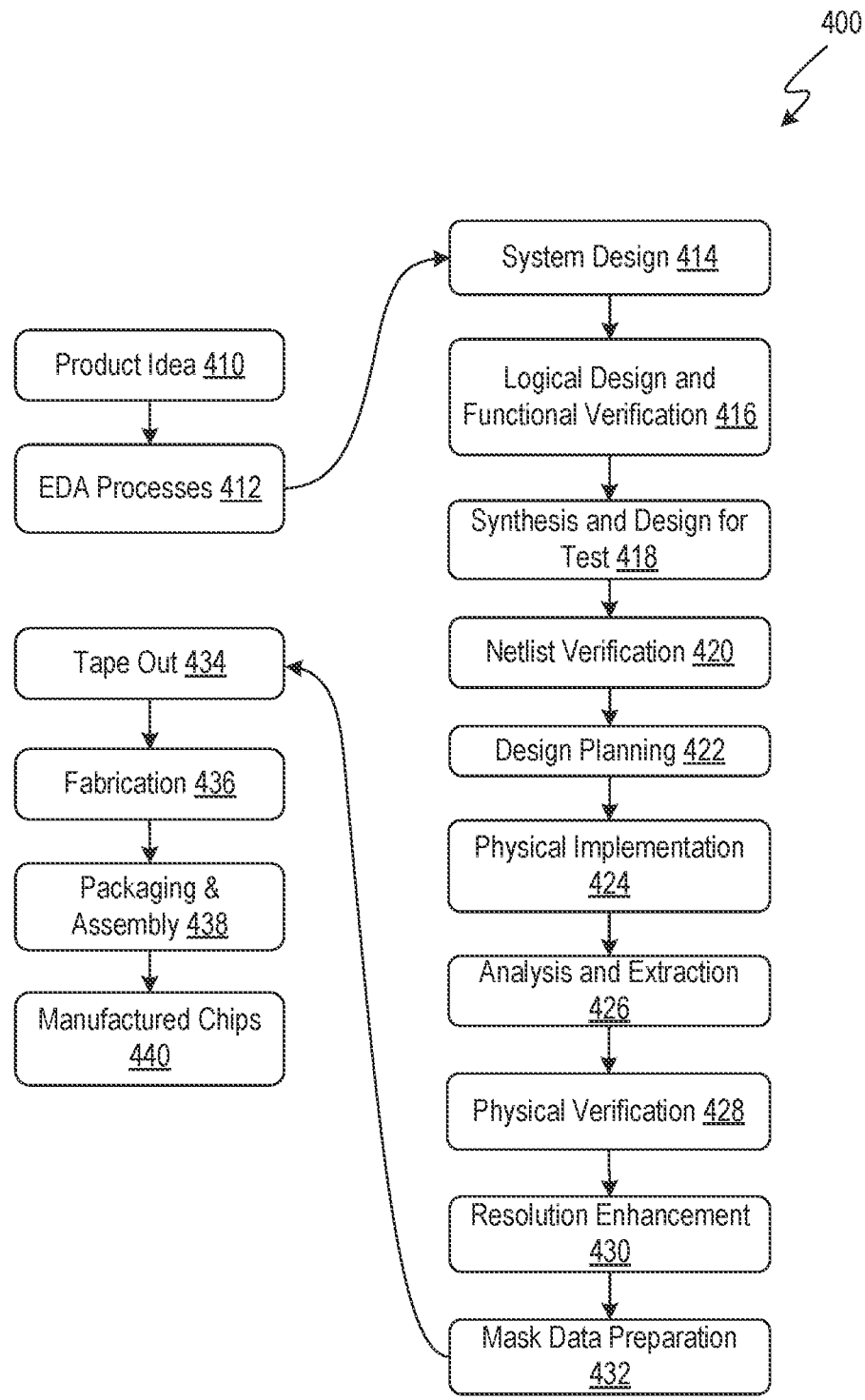
FIG. 4 illustrates an example flow for the design, verification, and fabrication of an integrated circuit in accordance with some embodiments described herein.

FIG. 4 illustrates an example flow 400 for the design, verification, and fabrication of an integrated circuit in accordance with some embodiments described herein. EDA processes 412 (the acronym "EDA" refers to "Electronic Design Automation") can be used to transform and verify design data and instructions that represent the integrated circuit. Each of these processes can be structured and enabled as multiple modules or operations.

Flow 400 can start with the creation of a product idea 410 with information supplied by a designer, information which is transformed and verified by using EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly 438 are performed to produce the manufactured IC chip 440.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as "emulators" or "prototyping systems" are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by sonic or all of the EDA products described herein, and products used for development of cells for the library and for physical and logical design that use the library.

Figure 5:
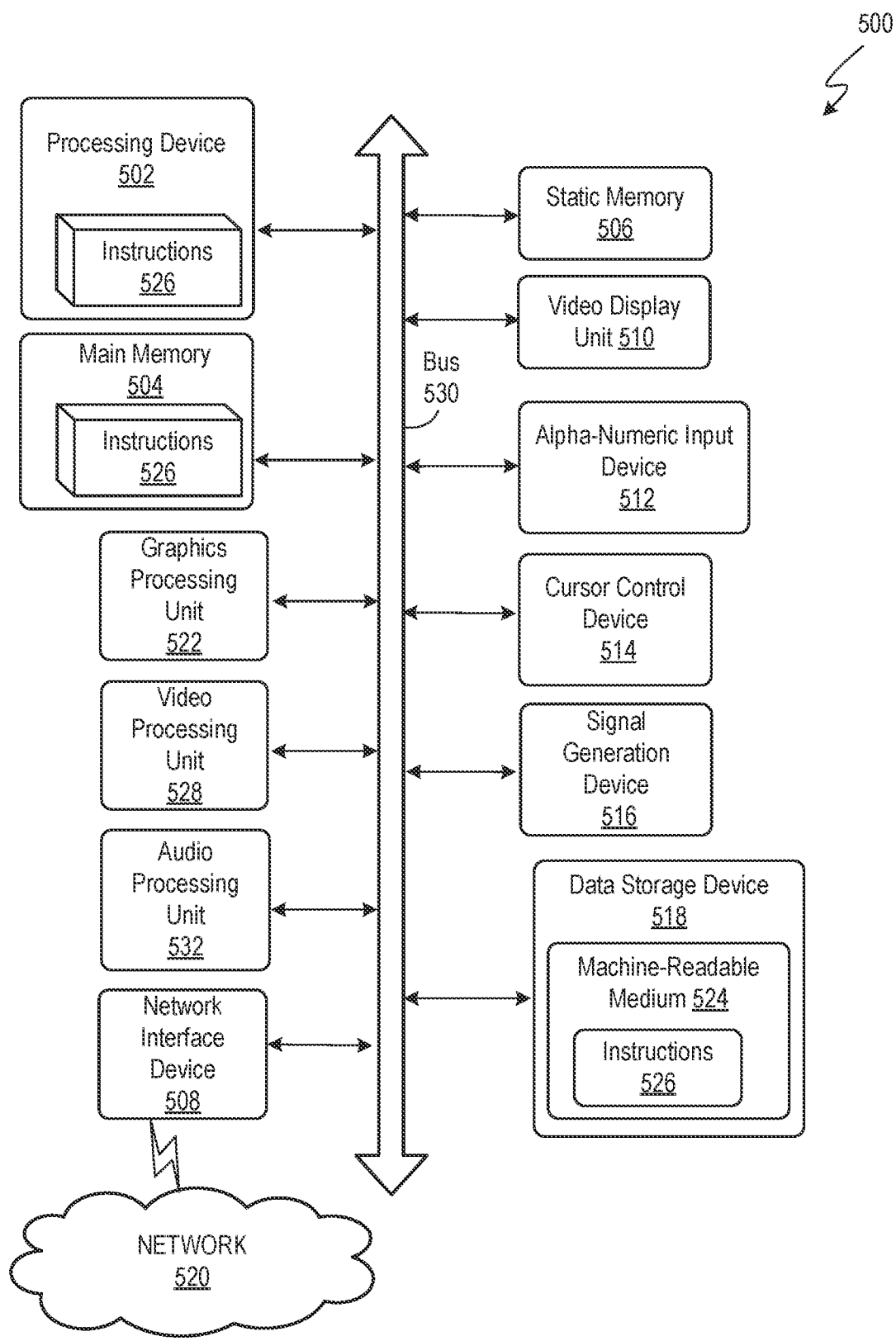
FIG. 5 illustrates an example machine of a computer system within which a set of instructions, for causing the machine to perform any one or more of the methodologies discussed herein, may be executed in accordance with some embodiments disclosed herein.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory. dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks. CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical. storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   obtaining a first set of critical dimension (CD) measurements of resist patterns created by a lithography process;
   obtaining a second set of CD measurements of wafer patterns created by an etch process, wherein the etch process creates the wafer patterns by removing material in areas of a wafer which are not covered by the resist patterns; and
   calibrating, by a processor, a forward etch model and an inverse etch model together by reducing (1) a first prediction error between the second set of CD measurements and a first set of simulated CDs predicted by the forward etch model based on the resist patterns, (2) a second prediction error between the first set of CD measurements and a second set of simulated CDs predicted by the inverse etch model based on the wafer patterns, and (3) a matching error between the forward etch model and the inverse etch model, wherein the matching error comprises a first term based on (w–$F_{etch}$($G_{etch}$(w))), where w represents the second set of CD measurements of wafer patterns, $F_{etch}$ represents the foward etch model, and $G_{etch}$ represents the inverse etch model.

2. The method of claim 1, wherein the first prediction error comprises a term based on (w–$F_{etch}$(r)), where r represents the first set of CD measurements of resist patterns.

3. The method of claim 1, wherein the second prediction error comprises a term based on (r–$G_{etch}$(w)), where r represents the first set of CD measurements of resist patterns.

4. The method of claim 1, wherein the matching error between the forward etch model and the inverse etch model comprises a second term based on (r–$G_{etch}$($F_{etch}$(r))), where r represents the first set of CD measurements of resist patterns.

5. The method of claim 1, further comprising:
determining a resist target by applying the inverse etch model to a design intent; and
determining a mask layout by performing lithography correction on the resist target.

6. The method of claim 5, further comprising:
determining simulated resist patterns based on the mask layout using a lithography model; and
determining simulated wafer patterns based on the simulated resist patterns using the forward etch model.

7. The method of claim 6, further comprising verifying the mask layout by comparing the design intent with the simulated wafer patterns.

8. The method of claim 6, wherein a level set method is used to determine the resist target by applying the inverse etch model to the design intent and determine the simulated wafer patterns based on the simulated resist patterns using the forward etch model.

9. A system, comprising:
a memory storing instructions; and
a processor, coupled with the memory and to execute the instructions, the instructions when executed cause the processor to:
obtain a first set of critical dimension (CD) measurements of resist patterns created by a lithography process;
obtain a second set of CD measurements of wafer patterns created by an etch process, wherein the etch process creates the wafer patterns by removing material in areas of a wafer which are not covered by the resist patterns; and
calibrate a forward etch model and an inverse etch model together by reducing a cost term that comprises a first term based on a difference between (1) the second set of CD measurements of wafer patterns and (2) simulated CD measurements obtained by applying the inverse etch model followed by the forward etch model to the wafer patterns, wherein the cost term comprises a second term based on (r–$G_{etch}$($F_{etch}$(r))), where r represents the first set of CD measurements of resist patterns.

10. The system of claim 9, wherein the cost term comprises a third term based on (w–$F_{etch}$(r)).

11. The system of claim 10, wherein the cost term comprises a fourth term based on (r–$G_{etch}$(w)).

12. The system of claim 9, wherein the instructions when executed cause the processor to:
determine a resist target by applying the inverse etch model to a design intent; and
determine a mask layout by performing lithography correction on the resist target.

13. The system of claim 12, wherein the instructions when executed cause the processor to:
determine simulated resist patterns based on the mask layout using a lithography model; and
determine simulated wafer patterns based on the simulated resist patterns using the forward etch model.

14. The system of claim 13, wherein the instructions when executed cause the processor to verify the mask layout by comparing the design intent with the simulated wafer patterns.

15. A non-transitory computer-readable medium comprising stored instructions, which when executed by a processor, cause the processor to:
obtain a first set of critical dimension (CD) measurements of resist patterns created by a lithography process;
obtain a second set of CD measurements of wafer patterns created by an etch process, wherein the etch process creates the wafer patterns by removing material in areas of a wafer which are not covered by the resist patterns; and
calibrate a forward etch model and an inverse etch model together by reducing (1) a first prediction error between the second set of CD measurements and a first set of simulated CDs predicted by the forward etch model based on the resist patterns, (2) a second prediction error between the first set of CD measurements and a second set of simulated CDs predicted by the inverse etch model based on the wafer patterns, and (3) a matching error between the forward etch model and the inverse etch model, wherein the matching error comprises a term bases on (r–$G_{etch}$($F_{etch}$(r))), where r represents the first set of CD measurements of resist patterns, $F_{etch}$ represents the foward etch model, and $G_{etch}$ represents the inverse etch model.

16. The non-transitory computer-readable medium of claim 15, wherein the first prediction error comprises a term based on (w–$F_{etch}$(r)), where w represents the second set of CD measurements of wafer patterns.

17. The non-transitory computer-readable medium of claim 15, wherein the second prediction error comprises a term based on (r–$G_{etch}$(w)), where w represents the second set of CD measurements of wafer patterns.

18. The non-transitory computer-readable medium of claim 15, wherein the cost term comprises a term based on (w–$F_{etch}$(r)), where w represents the second set of CD measurements of wafer patterns.

19. The non-transitory computer-readable medium of claim 15, wherein the cost term comprises a term based on (r–$G_{etch}$(w)), where w represents the second set of CD measurements of wafer patterns.

20. The non-transitory computer-readable medium of claim 15, wherein the instructions, which when executed by the processor, cause the processor to:
determine a resist target by applying the inverse etch model to a design intent;
determine a mask layout by performing lithography correction on the resist target;
determine simulated resist patterns based on the mask layout using a lithography model;

determine simulated wafer patterns based on the simulated resist patterns using the forward etch model; and verify the mask layout by comparing the design intent with the simulated wafer patterns.

\* \* \* \* \*